United States Patent
Joe et al.

(10) Patent No.: US 9,213,069 B2
(45) Date of Patent: Dec. 15, 2015

(54) APPARATUS OF ESTIMATING POWER OF SECONDARY BATTERY INCLUDING BLENDED CATHODE MATERIAL AND METHOD THEREOF

(71) Applicant: LG CHEM, LTD., Seoul (KR)

(72) Inventors: Won-Tae Joe, Daejeon (KR); Sun-Young Cha, Daejeon (KR)

(73) Assignee: LG CHEM, LTD., Seoul (KR)

( * ) Notice: Subject to any disclaimer, the term of this patent is extended or adjusted under 35 U.S.C. 154(b) by 0 days.

(21) Appl. No.: 14/523,008

(22) Filed: Oct. 24, 2014

(65) Prior Publication Data

US 2015/0046110 A1 Feb. 12, 2015

Related U.S. Application Data

(63) Continuation of application No. PCT/KR2014/001277, filed on Feb. 17, 2014.

(30) Foreign Application Priority Data

Mar. 4, 2013 (KR) .................. 10-2013-0022963
Feb. 17, 2014 (KR) .................. 10-2014-0017727

(51) Int. Cl.
*G01R 31/36* (2006.01)
*H01M 10/44* (2006.01)
*H01M 10/48* (2006.01)

(52) U.S. Cl.
CPC ........ *G01R 31/3624* (2013.01); *G01R 31/3648* (2013.01); *G01R 31/3662* (2013.01); *G01R 31/3682* (2013.01); *H01M 10/44* (2013.01); *H01M 10/48* (2013.01)

(58) Field of Classification Search
CPC ........... G01R 31/3624; G01R 31/3648; G01R 31/3662; G01R 31/3682; G01R 31/3606; G01R 31/36; G01R 31/3644; G01R 31/3651; G01R 31/3655; G01R 31/3658; H02J 7/04; B60L 3/0046; B60L 11/1861; B60L 11/1868; H01M 10/30; H01M 10/48; H01M 10/44; H04B 1/40

See application file for complete search history.

(56) References Cited

U.S. PATENT DOCUMENTS

2004/0257087 A1 * 12/2004 Murakami .................. 324/426
2011/0121836 A1 5/2011 Kim et al.

FOREIGN PATENT DOCUMENTS

JP 2001-351696 A 12/2001
KR 10-2004-0060921 A 7/2004

(Continued)

OTHER PUBLICATIONS

International Search Report, issued in PCT/KR2014/001277, dated Jun. 2, 2014.

(Continued)

*Primary Examiner* — Manual L Barbee
(74) *Attorney, Agent, or Firm* — Birch, Stewart, Kolasch & Birch, LLP (57) ABSTRACT

Disclosed are an apparatus and method for estimating the power of a secondary battery including a blended cathode material. The apparatus according to the present disclosure includes a sensor configured to measure a discharge current of a secondary battery comprising a cathode including a blended cathode material, and a control unit configured to estimate a state of charge of the secondary battery, determine a discharge voltage of the secondary battery using a first resistance predefined corresponding to the state of charge under a first condition in which a magnitude of the discharge current is smaller than a magnitude of a critical current and a second resistance predefined corresponding to the state of charge under a second condition in which the magnitude of the discharge current is larger than the magnitude of the critical current, and determine the power of the secondary battery from the determined discharge voltage and the measured discharge current.

25 Claims, 6 Drawing Sheets

(56) References Cited

FOREIGN PATENT DOCUMENTS

| | | |
|---|---|---|
| KR | 10-2004-0093808 A | 11/2004 |
| KR | 10-2011-0057468 A | 6/2011 |

OTHER PUBLICATIONS

Written Opinion of the International Searching Authority, issued in PCT/KR2014/001277, dated Jun. 2, 2014 with translation.

* cited by examiner

APPARATUS OF ESTIMATING POWER OF SECONDARY BATTERY INCLUDING BLENDED CATHODE MATERIAL AND METHOD THEREOF

CROSS-REFERENCE TO RELATED APPLICATION

The present application is a continuation of International Application No. PCT/KR2014/001277 filed on Feb. 17, 2014, which claims priority to Korean Patent Application No. 10-2013-0022963 filed in the Republic of Korea on Mar. 4, 2013 and Korean Patent Application No. 10-2014-0017727 filed in the Republic of Korea on Feb. 17, 2014, the disclosures of which are incorporated herein by reference.

TECHNICAL FIELD

The present disclosure relates to an apparatus and method for estimating the power of a secondary battery including a blended cathode material.

BACKGROUND ART

A battery is a device that produces electrical energy through electrochemical oxidation and reduction reactions, and has a wide range of various applications. For example, an application field of a battery is gradually expanding to a power source of handheld portable devices such as a mobile phone, a laptop computer, a digital camera, a video camera, a tablet computer, and an electric tool; various types of electric drive devices such as an electric bike, an electric motorcycle, an electric vehicle, a hybrid vehicle, an electric boat, and an electric aircraft; an energy storage system used to store electricity generated through new renewable energy or excess electricity of a power plant; and an uninterruptible power supplier for stable power supply to various types of information and communication devices including a server computer and a base station for communication.

A battery includes three basic elements; one is an anode including a material which oxides while emitting electrons during discharge, another is a cathode including a material which reduces while accepting electrons during discharge, and the other is an electrolyte which allows ions to move between the anode and the cathode.

A battery may be classified into a primary battery that cannot be reused after discharged, and a secondary battery that can be charged and discharged repeatedly due to at least partially reversible electrochemical reactions.

As a secondary battery, a lead-acid battery, a nickel-cadmium battery, a nickel-zinc battery, a nickel-iron battery, a silver-oxide battery, a nickel metal hydride battery, a zinc-manganese dioxide battery, a zinc-bromine battery, a metal-air battery, and a lithium secondary battery are known. Among them, a lithium secondary battery has a higher energy density, a higher battery voltage, and a longer lifespan than the other secondary batteries, and for these reasons, is attracting the greatest attention in commercial aspects.

A lithium secondary battery is characterized by intercalation and deintercalation reactions of a lithium ion occurring at a cathode and an anode. That is, during discharge, a lithium ion deintercalated from an anode material included in an anode moves to a cathode through an electrolyte and are intercalated into a cathode material included in the cathode, and vice versa when charging.

In the lithium secondary battery, because a material used as a cathode material significantly affects performance of the secondary battery, various attempts have been made to provide a cathode material having a high energy capacity while maintaining stability at high temperature as well as having low manufacturing costs. However, there is still a limitation in satisfying all the industrial performance standards with only one cathode material.

Recently, with the growing concerns on exhaustion of fossil fuels and air pollution, there is a drastic increase in demand for eco-friendly energy. In this context, commercialization of an electric drive vehicle such as an electric vehicle or a hybrid vehicle that is powered and runs by electrical energy supplied from a secondary battery is being accelerated by developed countries.

A speed of an electric drive vehicle is proportional to power of a secondary battery. Accordingly, a control unit of the electric drive vehicle has a function of monitoring how much power the secondary battery can provide. Also, the control unit controls various types of driving devices including a motor to safely drive the electric drive vehicle within a range of power the secondary battery can provide. Therefore, to optimize the travel performance of the electric drive vehicle, there is a need for a method for accurately calculating the power of the secondary battery.

DISCLOSURE

Technical Problem

The power of a secondary battery is influenced by electrochemical properties of a cathode material. Thus, the secondary battery may exhibit a unique electrochemical behavior based on a type of the cathode material included in the secondary battery. In this case, accurately estimating the power of the secondary battery is difficult.

The present disclosure is directed to providing an apparatus and method for accurately estimating the power of a secondary battery including a blended cathode material comprising at least two cathode materials in consideration of performance required for the secondary battery in the market and exhibiting a unique electrochemical behavior due to the blended cathode material.

Technical Solution

To achieve the above object, an apparatus for estimating the power of a secondary battery according to the present disclosure includes a sensor configured to measure a discharge current of a secondary battery including a cathode including a blended cathode material, an anode, and a separator, the blended cathode material including at least a first cathode material and a second cathode material, an operating voltage range of the first cathode material being higher than an operating voltage range of the second cathode material, and a control unit configured to estimate a state of charge of the secondary battery, estimate a discharge voltage of the secondary battery using a first resistance predefined corresponding to the state of charge under a first condition in which a magnitude of the discharge current is smaller than a magnitude of a critical current and a second resistance predefined corresponding to the state of charge under a second condition in which the magnitude of the discharge current is larger than the magnitude of the critical current, and estimate the power of the secondary battery from the estimated discharge voltage and the measured discharge current.

Here, the operating voltage range represents a voltage range in which an electrochemical reaction occurs during discharge of the secondary battery. For example, in the case of a lithium secondary battery, as an electrochemical reaction of intercalation of a lithium ion into a cathode material occurs during discharge, the operating voltage range represents a voltage range in which the lithium ion is intercalated into the cathode material.

Because the operating voltage range of the first cathode material is relatively higher than the operating voltage range of the second cathode material, the first cathode material participates in the electrochemical reaction earlier when the secondary battery is continuously discharged. Also, when the electrochemical reaction of the first cathode material is nearly completed, the second cathode material participates in the electrochemical reaction. A voltage at which the second cathode material begins participating in the electrochemical reaction may be uniquely determined based on types and a blend ratio of the first cathode material and the second cathode material. In the present disclosure, the voltage at which the second cathode material begins participating in the electrochemical reaction is defined as a transition voltage.

The state of charge is a parameter indicating a residual charge amount remaining in the secondary battery, and in the field to which the present disclosure belongs, it is expressed by a parameter of SOC or z. The parameter SOC is used to indicate the state of charge in % scale, and the parameter z is used to represent the state of charge in a normalized range of 0-1.

The state of charge may be determined as a relative ratio of a current remaining dischargeable capacity to the total discharge capacity of the secondary battery when discharged from the upper limit to the lower limit of the operating voltage range the secondary battery has.

The state of charge may be estimated by a method known in the art, for example, a calculation method using integration of a charge current and a discharge current of the secondary battery, an estimation method from an open-circuit voltage of the secondary battery, an estimation method using a Kalman filter or an extended Kalman filter, and the like.

Thus, the state of charge may be easily estimated by selectively applying many methods known in the field to which the present disclosure belongs.

The discharge voltage of the secondary battery represents a voltage of the secondary battery when the discharge current flows out of the secondary battery for a predetermined period of time. The discharge voltage of the secondary battery decreases as the discharge current increases in magnitude.

In case in which the secondary battery includes one cathode material, the discharge voltage of the secondary battery linearly decreases as the discharge current from the secondary battery increases in magnitude. Also, a decreasing slope of the discharge voltage corresponds to resistance of the secondary battery, and the decreasing slope tends to have a constant value irrespective of the magnitude of the discharge current.

In the secondary battery including the first cathode material and the second cathode material having different operating voltage ranges, a kind of a cathode material involved in the electrochemical reaction is changed based on the voltage range, and when the cathode material change occurs, the resistance of the secondary battery changes accordingly.

Thus, when the second cathode material begins participating in the electrochemical reaction during discharge of the secondary battery, the decreasing slope of the discharge voltage, that is, the resistance of the secondary battery changes.

The resistance change phenomenon occurs when the state of charge of the secondary battery belongs to a proper range and the discharge current increases in magnitude, thereby dropping a voltage to the transition voltage at which the second cathode material initiates participating in the electrochemical reaction.

In other words, when the state of charge of the secondary battery is excessively high, even if the discharge current increases in magnitude, the voltage of the secondary battery does not drop down to the transition voltage. Also, when the state of charge of the secondary battery is excessively low, because the electrochemical reaction of the first cathode material is actually completed and only the second cathode material gets involved in the electrochemical reaction, the resistance change due to the change in cathode material does not occur.

In the present disclosure, a predetermined state of charge range in which the resistance change of the secondary battery can be observed during discharge of the secondary battery is defined as a resistance change range.

Also, in the present disclosure, the discharge current at which the resistance change of the secondary battery starts to be substantially observed is defined as a critical current.

Also, in the present disclosure, the resistance of the secondary battery before the resistance change is defined as a first resistance, and the resistance of the secondary battery after the resistance change is defined as a second resistance.

The magnitude of the critical current becomes larger as the state of charge of the secondary battery increases within the resistance change range. The reason is that if the state of charge increases within the resistance change range, the voltage of the secondary battery drops down to the transition voltage when the discharge current sufficiently increases in magnitude.

The first resistance and the second resistance may be, through a test, predefined for each state of charge of the secondary battery. The first resistance increases as the state of charge of the secondary battery becomes lower within the resistance change range. Also, the second resistance does not show a significant change even if the state of charge of the secondary battery changes within the resistance change range.

Preferably, to obtain the first resistance and/or the second resistance, the control unit may refer to data associated with the first resistance and/or the second resistance predefined for each state of charge.

Preferably, the control unit may obtain the magnitude of the critical current corresponding to the estimated state of charge by referring to data associated with the magnitude of the critical current predefined for each state of charge, and may determine the first condition and the second condition.

According to one aspect, the control unit may, under the first condition, estimate the discharge voltage of the secondary battery using a first voltage variation amount calculated from the first resistance and the measured discharge current. Here, the first voltage variation amount may be calculated by the Ohmic law.

Preferably, the control unit may estimate the discharge voltage of the secondary battery by reducing the first voltage variation amount from the first voltage of the secondary battery predefined corresponding to the estimated state of charge.

Here, the first voltage is an open-circuit voltage of the secondary battery corresponding to the estimated state of charge. To obtain the first voltage, the control unit may refer to data associated with the open-circuit voltage predefined for each state of charge of the secondary battery.

The data associated with the open-circuit voltage may be obtained by conducting a discharge test of the secondary battery under the condition in which the open-circuit voltage of the secondary battery may be accurately measured based on the state of charge.

According to another aspect, the control unit may, under the second condition, estimate the discharge voltage of the secondary battery using a second voltage variation amount calculated from the second resistance and the measured discharge current. Here, the second voltage variation amount may be calculated by the Ohmic law.

Preferably, the control unit may estimate the discharge voltage of the secondary battery by reducing the second voltage variation amount from the second voltage of the secondary battery predefined corresponding to the estimated state of charge.

The second voltage may be uniquely determined based on types and a blend ratio of the first cathode material and the second cathode material. The second voltage may be obtained by experimentally observing how the discharge voltage of the secondary battery changes based on the magnitude of the discharge current when the secondary battery in any state of charge is discharged. The second voltage may be predefined as a fixed value or a variable value (for example, transition voltage) for each state of charge of the secondary battery. Also, as the secondary battery degrades, the second cathode material operates in a low voltage range. Thus, the second voltage may be predefined to lower its value based on an extent to which the secondary battery degrades.

According to still another aspect, the apparatus for estimating the power of a secondary battery according to the present disclosure may further include a storage unit connected with the control unit, and the control unit may store the estimated power of the secondary battery in the storage unit.

According to yet another aspect, the apparatus for estimating the power of a secondary battery according to the present disclosure may further include a communication interface connected with the control unit, and the control unit may output the estimated power of the secondary battery to an external device through the communication interface.

According to further another aspect, the apparatus for estimating the power of a secondary battery according to the present disclosure may further include a display unit connected with the control unit, and the control unit may display the estimated power of the secondary battery as a graphical interface through the display unit.

In the present disclosure, the storage unit may store and update data about at least one selected from the group consisting of the first resistance, the second resistance, the magnitude of the critical current, the first voltage, and the second voltage, defined for each state of charge.

According to another aspect, the apparatus for estimating the power of a secondary battery according to the present disclosure may be included in various electrically-driven devices using the secondary battery as an energy source.

To achieve the above object, a method for estimating the power of a secondary battery according to the present disclosure includes measuring a discharge current of a secondary battery comprising a cathode including a blended cathode material, an anode, and a separator, the blended cathode material including at least a first cathode material and a second cathode material and an operating voltage range of the first cathode material being higher than an operating voltage range of the second cathode material, estimating a state of charge of the secondary battery, estimating a discharge voltage of the secondary battery using a first resistance predefined corresponding to the state of charge under a first condition in which a magnitude of the discharge current is smaller than a magnitude of a critical current and a second resistance predefined corresponding to the state of charge under a second condition in which the magnitude of the discharge current is larger than the magnitude of the critical current, and estimating the power of the secondary battery from the estimated discharge voltage and the measured discharge current.

Optionally, the method for estimating the power of a secondary battery according to the present disclosure may further include storing the estimated power of the secondary battery, and/or outputting the estimated power of the secondary battery to outside, and/or displaying the estimated power of the secondary battery as a graphical interface.

The object of the present disclosure may be also achieved by a computer-readable recording medium having a computer program recorded thereon for performing the method for estimating the power of a secondary battery.

Advantageous Effects

According to the present disclosure, the power of a secondary battery including a blended cathode material may be estimated easily and simply in a state of charge range in which the secondary battery changes in resistance.

BRIEF DESCRIPTION OF DRAWINGS

The accompanying drawings illustrate a preferred embodiment of the present disclosure and together with the foregoing disclosure, serve to provide further understanding of the technical spirit of the present disclosure, and thus, the present disclosure is not construed as being limited to the drawing.

BEST MODE FOR CARRYING OUT THE INVENTION

Hereinafter, exemplary embodiments of the present disclosure will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation. Therefore, the description proposed herein is just a preferable example for the purpose of illustrations only, not intended to limit the scope of the disclosure, so it should be understood that other equivalents and modifications could be made thereto without departing from the spirit and scope of the disclosure.

The embodiments described below relates to a case in which the technical aspects of the present disclosure are applied to a lithium secondary battery. Here, the lithium secondary battery represents a secondary battery in which a lithium ion acts as a working ion and causes an electrochemical reaction at a cathode and an anode during charge and discharge. The working ion represents an ion participating in the electrochemical oxidation and reduction reactions during charge or discharge of the secondary battery, and for example, lithium may work so. Accordingly, any secondary battery using a lithium ion as a working ion should be construed as being included in the scope of the lithium secondary battery even though the name of the secondary battery changes based on a type of an electrolyte or a separator used in the lithium secondary battery, a type of a casing used to package the secondary battery, an internal or external structure of the lithium secondary battery, and the like.

Also, the present disclosure may be applied to other secondary batteries than a lithium secondary battery. Accordingly, even though a working ion is not a lithium ion, any secondary battery to which the technical aspects of the present disclosure may be applied should be construed as being included in the scope of the present disclosure regardless of its type.

Also, the secondary battery is not limited to a number of elements constituting the secondary battery. Accordingly, the secondary battery should be construed as including not only a unit cell including an anode, an electrolyte, and a cathode as a basic unit, but also an assembly of unit cells, a module comprising a plurality of assemblies connected in series and/or in parallel, a pack comprising a plurality of modules connected in series and/or in parallel, a battery system comprising a plurality of packs connected in series and/or in parallel, and the like.

In an exemplary embodiment of the present disclosure, the secondary battery includes $LiNi_{1/3}Co_{1/3}Mn_{1/3}O_2$ (NMC cathode material) and $LiFePO_4$ (LFP cathode material) as a first cathode material and a second cathode material, respectively. A blend ratio of the NMC cathode material and the LFP cathode material is 7:3 (weight ratio). An anode material included in the secondary battery is graphite, and as an electrolyte, an electrolyte solution is used in which a lithium salt $LiPF_6$ is added to a solvent of ethylene carbonate (EC): dimethyl carbonate (DMC): ethyl methyl carbonate (EMC) at a mix ratio of 3:4:3 (weight ratio). A separator coated with inorganic particles on a surface of a porous polyolefin substrate was used. The secondary battery was fabricated in the form of a pouch-type secondary battery, and has a capacity of 43.05 Ah. The secondary battery was manufactured to allow it to be charged and discharged in a range of 2.6V to 4.2V based on an open-circuit voltage (OCV).

Figure 1:
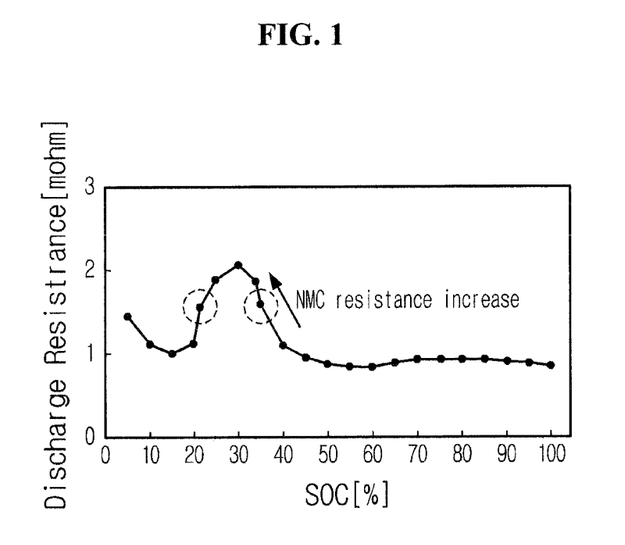
FIG. 1 is a graph showing a result of measuring resistance of a secondary battery as a function of state of charge during pulse discharge of the secondary battery at a discharge rate of 5 c.
Figure 2:
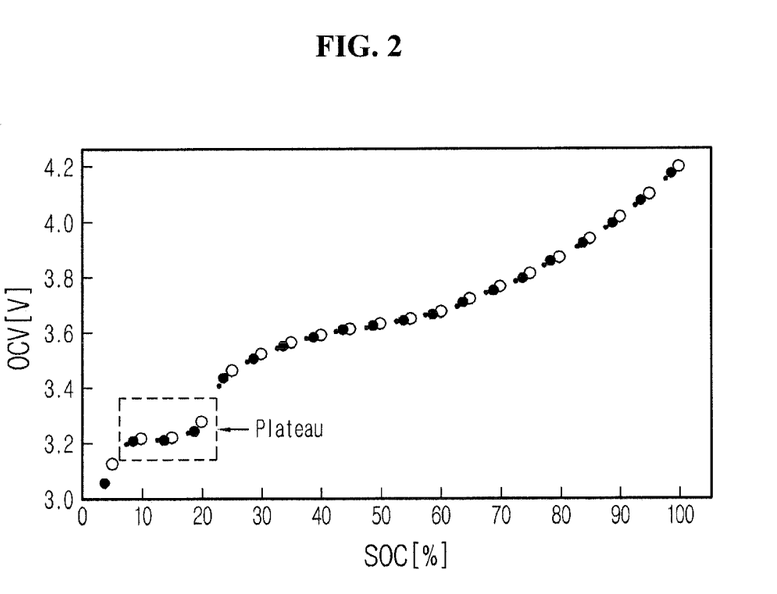
FIG. 2 is a graph showing a result of measuring an open-circuit voltage of a secondary battery as a function of state of charge during pulse discharge of the secondary battery at a discharge rate of 5 c.

FIGS. 1 and 2 are graphs respectively showing a result of measuring resistance and an open-circuit voltage of the secondary battery as a function of state of charge (SOC) during pulse discharge of the secondary battery at a discharge rate of 5 c.

Referring to FIG. 1, it can be observed that a convex pattern where resistance of the secondary battery partially increases and then decreases is formed in a specific SOC range (approximately, in a range of 20 to 40%), and two inflection points (see dotted line circles) occur before and after an apex of the convex pattern.

Referring to FIG. 2, a voltage plateau (see a dotted line box) including the inflection points in the specific SOC range can be observed. Here, the voltage plateau represents a profile part having a small voltage change with respect to the inflection points.

The reason that the convex pattern and the voltage plateau is observed in the resistance and open-circuit voltage profiles of the secondary battery is because a type of a cathode material into which a lithium ion is intercalated during discharge of the secondary battery in the specific SOC range changes from an NMC cathode material to an LFP cathode material.

That is, when the secondary battery is discharged in an SOC range higher than the SOC range causing a change in cathode material, a lithium ion is mainly intercalated into an NMC cathode material, and as an amount of lithium ions intercalated into the NMC cathode material increases, the open-circuit voltage of the secondary battery becomes lower. In contrast, when the secondary battery is discharged in an SOC range lower than the SOC range causing a change in cathode material, a lithium ion is mainly intercalated into an LFP cathode material, and as an amount of lithium ions intercalated into the LFP cathode material increases, the open-circuit voltage of the secondary battery becomes lower. Also, when the secondary battery is discharged in the SOC range causing a change in cathode material, as a considerable portion of capacity for a lithium ion to intercalate into an NMC cathode material is consumed, the lithium ion begins to be intercalated into an LFP cathode material. Even while the lithium ion is being intercalated into the LFP cathode material, the lithium ion is continuously intercalated into the NMC cathode material, and when the NMC cathode material consumes all the capacity to accept the intercalation of the lithium ion, the lithium ion is intercalated into only the LFP cathode material from then.

This change in cathode material type occurs when the secondary battery is discharged in the SOC range corresponding to a voltage range near 3.2V at which the inflection points are formed on the OCV profile shown in FIG. 2.

Referring to the convex pattern shown in FIG. 1, in an SOC range on the right side of the apex, the resistance of the secondary battery suddenly increases, and conversely, in an SOC range on the left side of the apex, the resistance of the secondary battery decreases again.

Here, the reason that the resistance of the secondary battery suddenly increases in the convex pattern is because the resistance of the NMC cathode material suddenly increases as the NMC cathode material consumes a majority of capacity to accept the lithium ion.

Also, the reason that the resistance of the secondary battery decreases again in the convex pattern is because with the start of intercalation of the lithium ion into the LFP cathode material, low resistance characteristics of the LFP cathode material exhibit as the resistance of the secondary battery.

Further, it can be seen that when the secondary battery is discharged in an SOC range lower than the SOC range causing a change in cathode material, as the SOC becomes lower, the resistance of the secondary battery increases again. This resistance increase is caused by the anode material (graphite), a resistance of which increases in the lower SOC range.

Figure 3:
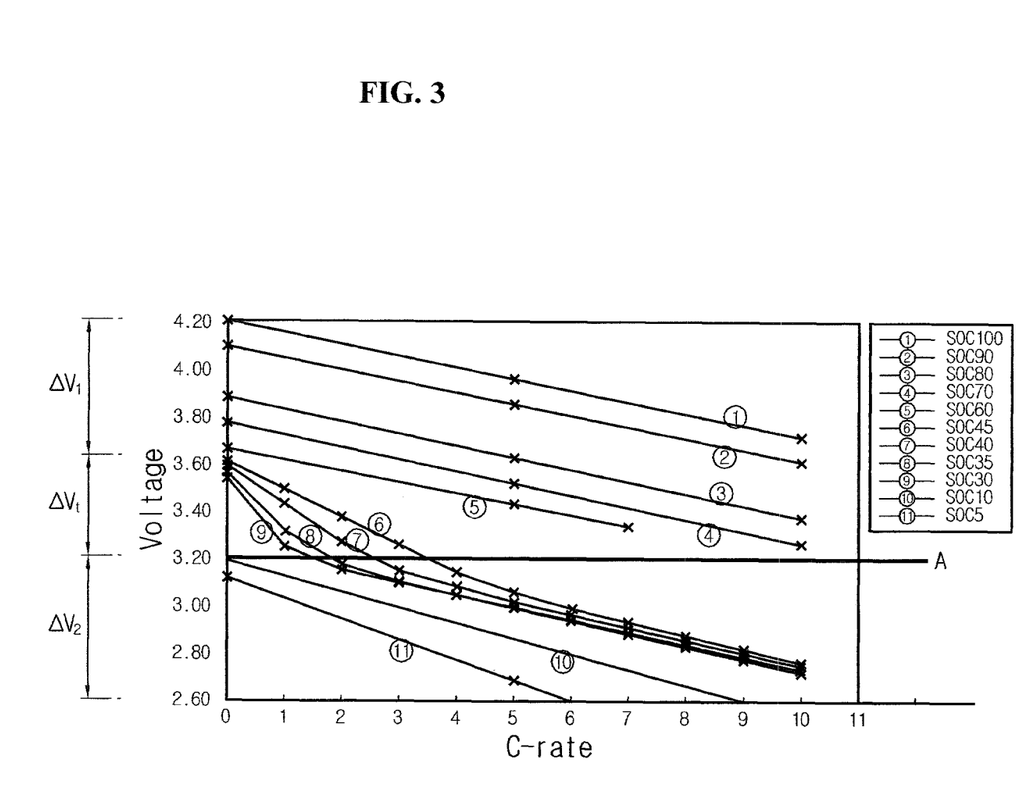
FIG. 3 is a graph showing I-V profiles obtained by measuring variation patterns of discharge voltage in accordance with varying in state of charge when pulse discharging a secondary battery at different magnitudes of discharge rates.

FIG. 3 is a graph showing I-V profiles obtained by measuring variation patterns of discharge voltage ($V_{dis}$) while varying SOC of the secondary battery during pulse discharge of the secondary battery at the discharge current having different magnitudes.

A horizontal axis of the graph shown in FIG. 3 represents a discharge rate (c-rate) converted from the magnitude of the discharge current, and a vertical axis represents a discharge voltage ($V_{dis}$) of the secondary battery. On the vertical axis, considering a usage voltage range 2.60-4.20V of the secondary battery, the total usage voltage range was indicated. Obviously, the usage voltage range of the secondary battery may change based on types and a blend ratio of the first cathode material and the second cathode material.

Here, the discharge voltage ($V_{dis}$) represents a voltage of the secondary battery measured immediately after pulse discharge of the secondary battery for 10 seconds. Also, when pulse discharging the secondary battery at the discharge current having a plurality of different magnitudes, an open-circuit voltage of the secondary battery before the start of pulse discharge was set to be equal. Thus, a plurality of points on the same profile indicates a result of measuring the discharge voltage ($V_{dis}$) when the secondary battery is pulse discharged at the discharge current having different magnitudes under the same SOC condition.

In FIG. 3, a point where each profile intersects a Y axis indicates the voltage of the secondary battery before the start of pulse discharge, and substantially corresponds to the open-circuit voltage.

For example, the I-V profile (①) corresponding to SOC 100% shows how the discharge voltage ($V_{dis}$) changes while the secondary battery is discharged for 10 seconds under the conditions of discharge rates of 5 c and 10 c respectively when the open-circuit voltage of the secondary battery is 4.20V.

The usage voltage range indicated on the vertical axis of FIG. 3 may be divided into a first voltage range ($\Delta V_1$), a transition voltage range ($\Delta V_t$), and a second voltage range ($\Delta V_2$).

The I-V profiles in which the Y intercept (i.e., open-circuit voltage) belongs to the first voltage range ($\Delta V_1$) and the second voltage range ($\Delta V_2$) have a decreasing pattern of the discharge voltage ($V_{dis}$) having a constant slope. In contrast, the profile in which the Y intercept (i.e., open-circuit voltage) belongs to the transition voltage range ($\Delta V_t$) has such a pattern that a decreasing slope of the discharge voltage ($V_{dis}$) changes.

First, when the open-circuit voltage of the secondary battery belongs to the first voltage range ($\Delta V_1$), while the secondary battery is pulse discharged, the working ion is mainly intercalated into the NMC cathode material. Thus, irrespective of the discharge rate of the secondary battery, the discharge voltage ($V_{dis}$) decreases while showing dependency on resistance characteristics of the NMC cathode material.

It can be seen that the decreasing slope of the I-V profiles (①-⑤) in which the open-circuit voltage of the secondary battery belongs to the first voltage range ($\Delta V_t$) is nearly constant, and as the open-circuit voltage before the start of discharge becomes lower within the first voltage range ($\Delta V_1$), the I-V profiles are shifted downward in parallel.

The decreasing slope of the I-V profiles (①-⑤) is a ratio of a change in discharge voltage to a change in discharge rate, and thus, substantially corresponds to the resistance of the secondary battery. However, because the decreasing slope of the I-V profiles (①-⑤) is constant, it can be seen that the secondary battery of which the open-circuit voltage belongs to the first voltage range ($\Delta V_1$) maintains the resistance even though the magnitude of the discharge current changes.

Subsequently, the I-V profiles (⑥-⑨) when the open-circuit voltage of the secondary battery belongs to the transition voltage range ($\Delta V_t$) have a characteristic that a decreasing slope changes at around 3.2V.

The 3.2V corresponds to a transition voltage (see a dotted line box in FIG. 2) at which the cathode material into which the lithium ion is intercalated starts to change from the NMC cathode material to the LFP cathode material. Thus, when the discharge current increases in magnitude enough to drop the voltage of the secondary battery down to approximately 3.2V, the lithium ion begins to be intercalated into the LFP cathode material. Also, when the LFP cathode material starts to get involved in the electrochemical reaction, a resistance change of the secondary battery occurs. Referring to FIG. 3, a phenomenon in which the resistance of the secondary battery changes at around 3.2V is definitely observed from a change in decreasing slope of the I-V profiles (⑥-⑨), and it can be seen that the change in decreasing slope occurs in only the SOC range corresponding to the transition voltage range ($\Delta V_t$).

The present disclosure defines, as a resistance change range, the predetermined SOC range in which the resistance change of the secondary battery during discharge of the secondary battery may be observed as the slope change of the I-V profiles.

Also, the present disclosure defines, as a critical current magnitude, the magnitude of the discharge current at which the resistance change of the secondary battery occurs. In the graph of FIG. 3, the magnitude of the critical current may be approximately calculated from a discharge rate of a point where a straight line A meets the I-V profiles (⑥-⑨). Also, it can be seen that the magnitude of the critical current increases as the SOC of the secondary battery increases within the resistance change range. This is because as the SOC increases, the voltage of the secondary battery becomes lower enough for the second cathode material to get involved in the electrochemical reaction when the discharge current sufficiently increases in magnitude.

Also, the present disclosure defines the resistance of the secondary battery before the resistance change as a first resistance, and the resistance of the secondary battery after the resistance change as a second resistance.

The first resistance corresponds to a decreasing slope of a straight line segment disposed on the left side of the point where the I-V profile intersects the straight line A. Also, the second resistance corresponds to a decreasing slope of a straight line segment disposed on the right side of the point where the I-V profile intersects the straight line A.

Observing the straight line segments of the I-V profiles (⑥-⑨), the straight line segments on the left side of the intersection points have different decreasing slopes, and as the SOC before the start of discharge becomes lower, the decreasing slope increases. This is because the straight line segment on the left side of the intersection point corresponds to a range in which the NMC cathode material gets involved in the electrochemical reaction, and for the lithium ion to be intercalated into the NMC cathode material is more difficult as the SOC becomes lower, and thus the resistance of the secondary battery increases as much.

Also, the straight line segment on the right side of the intersection point hardly experiences a change in decreasing slope even if the SOC before the start of discharge changes. This is because the straight line segment on the right side of the intersection point corresponds to a range in which the LFP cathode material gets involved in the electrochemical reaction, and the LFP cathode material does not experience a big resistance change even at different SOCs before discharge.

Taking the foregoing into consideration, it is found that the first resistance increases as the SOC of the secondary battery is lower within the resistance change range, and the second resistance does not exhibit a significant change even if the SOC of the secondary battery changes within the resistance change range.

Subsequently, the open-circuit voltage before the start of discharge belongs to the second voltage range ($\Delta V_2$), while the secondary battery is pulse discharged, the lithium ion is mainly intercalated into the LFP cathode material irrespective of the magnitude of the discharge current. Thus, the I-V profiles (⑩-⑪) have a linearly decreasing pattern having a constant slope over the total discharge rate range, and the slope of the I-V profiles (⑩-⑪) increases as the open-circuit voltage before the start of discharge becomes lower within the second voltage range ($\Delta V_2$). This is because as the open-circuit voltage becomes lower, resistance of a material used as the anode material increases and thus the resistance of the secondary battery increases.

Because the I-V profiles ①-⑤ and ⑩-⑪ have a constant slope, even if the discharge rate of the secondary battery changes, the resistance of the secondary battery can be said to be constant. In contrast, it can be said that as the discharge rate of the secondary battery increases, the I-V profiles ⑥-⑨ gradually decrease and converge on a predetermined value.

The present disclosure is designed based on the above-mentioned experimental observations, and provides an apparatus and method for estimating the power of a secondary battery that may predefine a first resistance and a second resistance for each SOC in an SOC range in which a resistance change occurs, select a resistance value used in estimating a discharge voltage of the secondary battery based on a magnitude of a discharge current among the first resistance value and the second resistance, estimate a discharge voltage of the secondary battery using the selected resistance value, and estimate the power of the secondary battery using the estimated discharge voltage and the magnitude of the discharge current.

Figure 4:
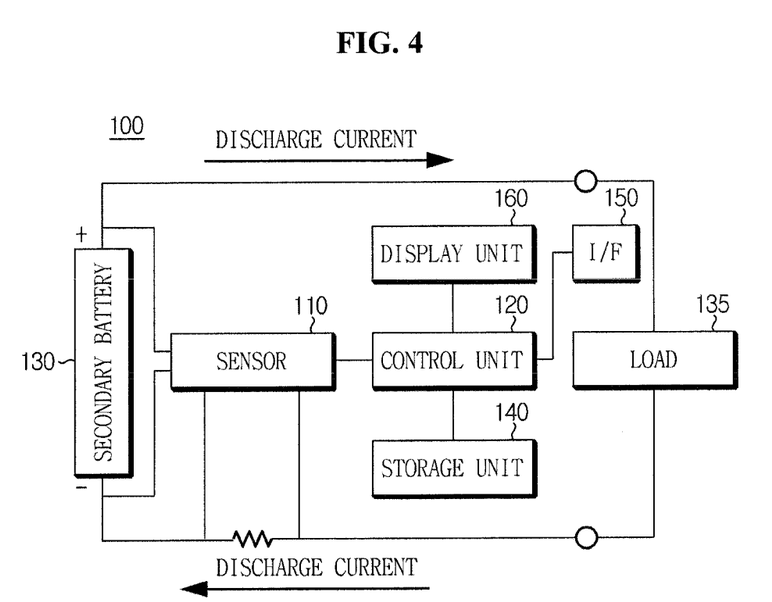
FIG. 4 is a block diagram illustrating a configuration of an apparatus for estimating the power of a secondary battery according to an exemplary example of the present disclosure.

FIG. 4 is a block diagram schematically illustrating a configuration of an apparatus 100 for estimating the power of a secondary battery according to an exemplary example of the present disclosure.

Referring to FIG. 4, the apparatus 100 for estimating the power of a secondary battery according to the present disclosure includes a sensor 110 and a control unit 120.

To estimate the power of a secondary battery 130 including a blended cathode material in a cathode, the apparatus 100 may be connected between the secondary battery 130 and a load 135.

The blended cathode material includes at least a first cathode material and a second cathode material, and an operating voltage range of the first cathode material is higher than that of the second cathode material. Thus, when the secondary battery is continuously discharged, the first cathode material primarily participates in an electrochemical reaction in a high voltage range and the second cathode material primarily participates in an electrochemical reaction in a low voltage range.

As an example, the first cathode material and the second cathode material may be an NMC cathode material and an LFP cathode material, respectively.

The secondary battery 130 may be a lithium secondary battery, however the present disclosure is not limited to a battery type.

The secondary battery 130 may be mounted in various types of electrically-driven devices capable of working by electrical energy, and the electrically-driven device is not limited to a specific type.

In one embodiment, the electrically-driven device may be a mobile computer device such as a mobile phone, a laptop computer, and a tablet computer, or a handheld multimedia device including a digital camera, a video camera, and an audio/video player device.

In another embodiment, the electrically-driven device may be an electric-powered device capable of moving by electricity, such as an electric vehicle, a hybrid vehicle, an electric bike, an electric motorcycle, an electric train, an electric boat, and an electric aircraft, or a power tool including a motor such as an electric drill and an electric grinder.

In still another embodiment, the electrically-driven device may be a large capacity energy storage system installed in an electrical grid to store electricity generated through new renewable energy or excess electricity of a power plant, and an uninterruptible power supplier to supply power to various types of information and communication devices including a server computer and mobile communication equipment in case of emergency, for example, a blackout.

The load 135 is included in various types of electrically-driven devices, and represents an energy consumption device included in the electrically-driven device that works by electrical energy supplied when the secondary battery 130 is discharged.

The load 135 may be, as a non-limiting example, a rotary device such as a motor or a power conversion device such as an inverter, however the present disclosure is not limited to a load type.

The sensor 110 may, under the control of the control unit 120, measure a discharge current of the secondary battery, and output a measured value of the discharge current to the control unit 120.

The sensor 110 may receive, from the control unit 120, a control signal for measuring the discharge current. When the control signal is received, the sensor 110 outputs the measured value of the discharge current to the control means 120.

The sensor 110 may further measure, under the control of the control unit 120, a charge current of the secondary battery 130, and output a measured value of the charge current to the control unit 120.

Also, the sensor 110 may further measure, under the control of the control unit 120, a voltage of the secondary battery 130, and output a measured value of the voltage to the control unit 120.

Also, the sensor 110 may further measure, under the control of the control unit 120, a temperature of the secondary battery 130, and output a measured value of the temperature to the control unit 120.

When the sensor 110 measures a plurality of characteristic values from the group of the current, the voltage, and the temperature of the secondary battery 130, the sensor 110 may include individually components capable of measuring each characteristic value, and it is obvious that the components capable of measuring each characteristic value may be divided.

The control unit 120 may receive inputs of the measured charge current value and the measured discharge current value through the sensor 110 during operation of the secondary battery 130, and may estimate an SOC of the secondary battery 130 by the Ampere counting method.

That is, the control unit 120 may estimate the SOC by calculating a relative ratio of an integrated amount of electric current flowing out from the secondary battery 130 to a predefined full charge capacity of the secondary battery 130. For example, when the relative ratio of the integrated amount of electric current flowing out to the full charge capacity is 20%, the SOC is 80%.

When estimating the SOC of the secondary battery 130, the control unit 120 may use not only the Ampere counting method but also a method known in the art, for example, a method for calculating SOC from an open-circuit voltage of the secondary battery, a method for calculating SOC using the Kalman filter or the extended Kalman filter, and the like.

When estimation of the power of the secondary battery 130 is needed, the control unit 120 may obtain the measured discharge current value by controlling the sensor 110, and when the magnitude of the discharge current is smaller than a magnitude of a critical current, may estimate the power of the secondary battery 130 based on a first condition, and on the contrary, when the magnitude of the discharge current is larger than the magnitude of the critical current, estimate the power of the secondary battery 130 based on a second condition.

According to one aspect, the magnitude of the critical current may be predefined for each SOC of the secondary battery 130. In this case, the control unit 120 may determine a 'predefined magnitude of the critical current' corresponding to a current SOC of the secondary battery 130, and may determine a condition to be used to estimate the power of the secondary battery 130 by comparing the magnitude of the discharge current to the determined magnitude of the critical current.

The magnitude of the critical current may be easily defined by obtaining I-V profiles as illustrated in FIG. 3 through a discharge test. The magnitude of the critical current may be defined as a magnitude of a discharge current corresponding to a point where each I-V profile corresponding to a resistance change range passes through a transition voltage (for instance, 3.2V) as described in the foregoing.

According to another aspect, the magnitude of the critical current may be calculated in real time using a 'predefined I-V profile' corresponding to a current SOC of the secondary battery 130.

Figure 5:
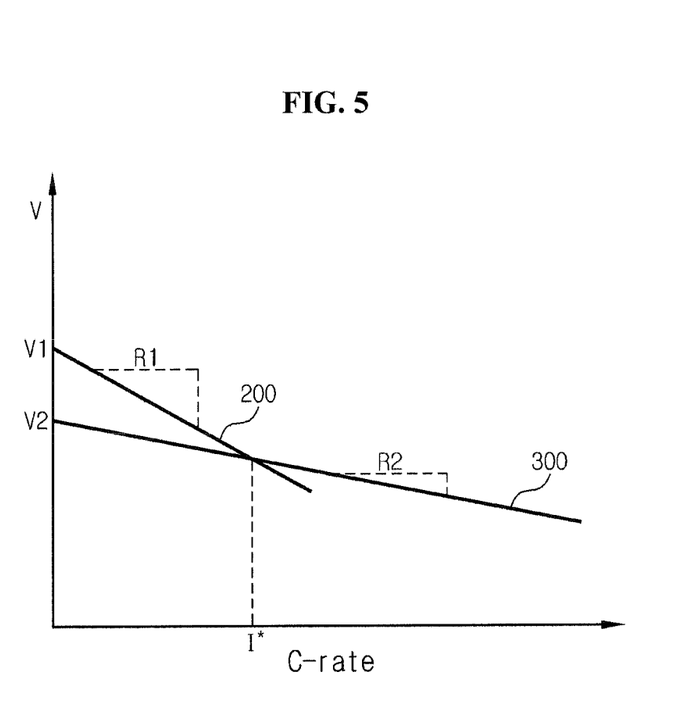
FIG. 5 is a graph showing that a first resistance and a second resistance of the present disclosure correspond to each slope of straight line segments on a left side and a right side of an I-V profile.

FIG. 5 is a graph showing the predefined I-V profile for a current SOC belonging to the resistance change range.

As shown in FIG. 5, when an SOC of the secondary battery 130 belongs to the resistance change range, there is a change in slope of the I-V profile representing a change in discharge voltage based on a magnitude of a discharge current.

However, because the left side and the right side of the I-V profile have approximately straight line segments, the I-V profile may be approximated by a combination of a left straight line segment 200 and a right straight line segment 300.

Thus, a magnitude of a critical current for the I-V profile may, approximately, be defined as a magnitude (I*) of a discharge current corresponding to a point where the left straight line segment 200 and the right straight line segment 300 meet.

Linear equations corresponding to the left straight line segment 200 and the right straight line segment 300 and the magnitude of the critical current may be defined as the following equation 1.

$$V_{dis} = V_1 - I_{dis} * R_1$$

$$V_{dis} = V_2 - I_{dis} * R_2$$

$$I^* = (V_1 - V_2)/(R_1 - R_2)$$ <Equation 1>

Here, $V_1$ denotes a voltage corresponding to a Y intercept of the linear equation of the left straight line segment 200, and corresponds to an open-circuit voltage before discharge of the secondary battery 130. $V_1$ may be predefined for each SOC of the secondary battery 130.

$V_2$ denotes a voltage corresponding to a Y intercept of the linear equation corresponding to the right straight line segment 300, and assuming the resistance of the secondary battery 130 has a resistance value corresponding to a slope of the right straight line segment 300 irrespective of a magnitude of a discharge current during discharge of the secondary battery 130, it corresponds to an open-circuit voltage before discharge of the secondary battery 130. $V_2$ may be predefined for each SOC of the secondary battery 130. Alternatively, $V_2$ may be set as a fixed value, for example, a transition voltage (see 3.2V in FIG. 3) of the secondary battery 130. The transition voltage corresponds, approximately, to a voltage at which the second cathode material starts to get involved in an electrochemical reaction. The transition voltage may be predefined to lower its value with the increasing degradation of the secondary battery 130.

$I_{dis}$ denotes a magnitude of a discharge current measured when the secondary battery 130 is discharged.

$R_1$ corresponds to a slope of the left straight line segment 200, and represents the resistance the secondary battery 130 has when the first cathode material primarily gets involved in an electrochemical reaction during discharge of the secondary battery 130, which corresponds to a first resistance of the present disclosure. $R_1$ may be predefined for each SOC of the secondary battery 130, and as an example, may be defined as an average slope of the I-V profile observed on the left side of the critical current.

$R_2$ corresponds to a slope of the right straight line segment 300, and represents the resistance the secondary battery 130 has when the second cathode material primarily gets involved in an electrochemical reaction during discharge of the secondary battery 130, which corresponds to a second resistance of the present disclosure. $R_2$ may be predefined for each SOC of the secondary battery 130, and as an example, may be defined as an average slope of the I-V profile observed on the right side of the critical current.

$V_{dis}$ denotes a discharge voltage when the secondary battery 130 is discharged at the discharge current $I_{dis}$.

When the I-V profile is defined as two linear equations represented by the above Equation 1, the magnitude of the critical current corresponding to the I-V profile corresponds to a magnitude of a discharge current corresponding to an intersection point of the two linear equations.

Data about $V_1$, $V_2$, $R_1$, and $R_2$ corresponding to parameters of the linear equations may be predefined for each SOC based on a plurality of I-V profiles obtained through a test. In this case, the control unit 120 may determine $V_1$, $V_2$, $R_1$, and $R_2$ corresponding to a current SOC of the secondary battery 130 by referring to the predefined parameters, and calculate the magnitude of the critical current using the determined parameters and the above Equation 1.

After the control unit 120 determines the magnitude of the critical current corresponding to the SOC of the secondary battery 130, the control unit 120 compares the magnitude of the critical current to the magnitude of the discharge current flowing out of the secondary battery 130.

When a first condition in which the magnitude of the critical current is smaller than the magnitude of the discharge current is satisfied, the control unit 120 determines a discharge voltage ($V_{dis1}$) of the secondary battery 130 by calculating a first resistance variation amount ($\Delta V_{dis1}$) in response to discharge of the secondary battery 130 using the predefined first resistance ($R_1$) corresponding to the SOC of the secondary battery 130 and the measured discharge current of the secondary battery 130. Also, the control unit 120 determines the power ($P_{dis1}$) of the secondary battery 130 from the measured discharge current and the determined discharge voltage ($V_{dis1}$).

When a second condition in which the magnitude of the critical current is equal to or larger than the magnitude of the discharge current is satisfied, the control unit 120 determines a discharge voltage ($V_{dis2}$) of the secondary battery 130 by calculating a second resistance variation amount ($\Delta V_{dis2}$) in response to discharge of the secondary battery 130 using the predefined second resistance ($R_2$) corresponding to the SOC of the secondary battery 130 and the measured discharge current of the secondary battery 130. Also, the control unit 120 determines the power ($P_{dis2}$) of the secondary battery 130 from the measured discharge current and the determined discharge voltage ($V_{dis2}$).

Preferably, the control unit 120 may determine the discharge voltage ($V_{dis1}$, $V_{dis2}$) of the secondary battery 130 using the follow Equation 2. $V_1$ and $V_2$ are a value predefined based on the SOC of the secondary battery.

$$V_{dis1} = V_1 - I_{dis} * R_1$$

$$V_{dis2} = V_2 - I_{dis} * R_2 \qquad \text{<Equation 2>}$$

According to one aspect, the control unit 120 may be electrically connected to the storage unit 140. Also, the control unit 120 may store and update all the parameters predefined in the storage unit 140, for example, data about the first voltage, the second voltage, the critical current, the first resistance, and the second resistance, and may store the power ($P_{dis1}$, $P_{dis2}$) of the secondary battery 130 determined under the first condition and the second condition.

The storage unit 140 is not limited to a specific type if it is a storage medium capable of recording and erasing information. As an example, the storage unit 140 may be random access memory (RAM), read-only memory (ROM), a register, a hard disc, an optical recording medium, or a magnetic recording medium. Also, the storage means 140 may be connected to the control unit 120 via, for example, a data bus, to allow access by the control unit 120. Also, the storage unit 140 may store and/or update and/or erase and/or transmit programs including various control logics executed by the control unit 120, and/or data generated by execution of the control logics, for example, $V_{dis1}$, $V_{dis2}$, $I_{dis}$, $P_{dis1}$, and $P_{dis2}$. The storage means 140 may be logically divided into at least two, and is not limited as being included in the control unit 120.

According to another aspect, the control unit 120 may be electrically connected to a communication interface 150 to exchange data with an external device. Also, the control unit 120 may transmit the determined power of the secondary battery 130 to the external device through the communication interface 150.

The external device may be a control means of a device equipped with the load 135. As an example, in the case where the secondary battery 130 is mounted in an electric vehicle, the control unit 120 may transmit the determined power of the secondary battery 130 to a controller that controls an operating mechanism of the electric vehicle in an integrated manner. Then, the controller may efficiently control the discharge of the secondary battery 130 using the received power information.

According to still another aspect, the control unit 120 may be electrically connected to a display unit 160. Also, the control unit 120 may display the determined power of the secondary battery 130 as graphical interface through the display unit 160. The graphical interface may include a number, a character, a graph, a drawing, or combinations thereof.

The display means 160 may be a liquid crystal display (LCD), a light-emitting diode (LED) display, an organic light-emitting diode (OLED) display, an electrophoretic ink (E-Ink) display, a flexible display, and the like. The display means 160 may be connected to the control means 130 directly or indirectly. When the latter is employed, the display means 160 may be located in a physically separate area from an area where the control unit 120 is located. Also, a third control means (not shown) may be interposed between the display means 160 and the control unit 120 to receive information to be displayed on the display means 160 from the control unit 120 and allow the information to be displayed on the display means 160. For this, the third control means may be connected to the control unit 120 via a communication line.

The display means 160 is not necessarily included in the apparatus according to the present disclosure, and may be included in other apparatus connected with the apparatus according to the present disclosure. In this case, the display means 160 may be indirectly connected to the control unit 120 by the medium of a control means included in other apparatus rather than being directly connected. Accordingly, it should be understood that an electrical connection of the display means 160 and the control unit 120 includes this indirect connection method.

To execute various control logics and/or calculation logics, the control unit 120 may optionally include a processor, an application-specific integrated circuit (ASIC), a chipset, a logic circuit, a register, a communication modem, and a data processing device, well known in the art. Also, when the control logic is implemented in software, the control unit 120 may be implemented as an assembly of program modules. In this instance, the program module may be stored in a memory and executed by a processor. The memory may be disposed inside or outside the processor, and may be connected to the processor by various known means. Also, the memory may be included in the storage unit 140. Also, the memory generally represents all devices storing information regardless of a device type, and does not indicate a specific memory device.

In the description of various embodiments of the present disclosure, it should be understood that elements called 'unit' are distinguished functionally rather than physically. Accordingly, each element may be selectively integrated with other element, or each element may be divided into sub-elements for efficient execution of the control logic(s). However, it is obvious to a person having ordinary skill in the art that even though elements are integrated or divided, if functions are found to be identical, the integrated or divided elements should be construed as falling within the scope of the present disclosure.

A selective combination of at least one of the various control logics and/or calculation logics of the control unit 120 may become an embodiment of a method for estimating the power of the secondary battery according to the present disclosure. In the following description of the method for estimating the power of a secondary battery, a repeated description of the previously described disclosure is omitted herein.

Figure 6:
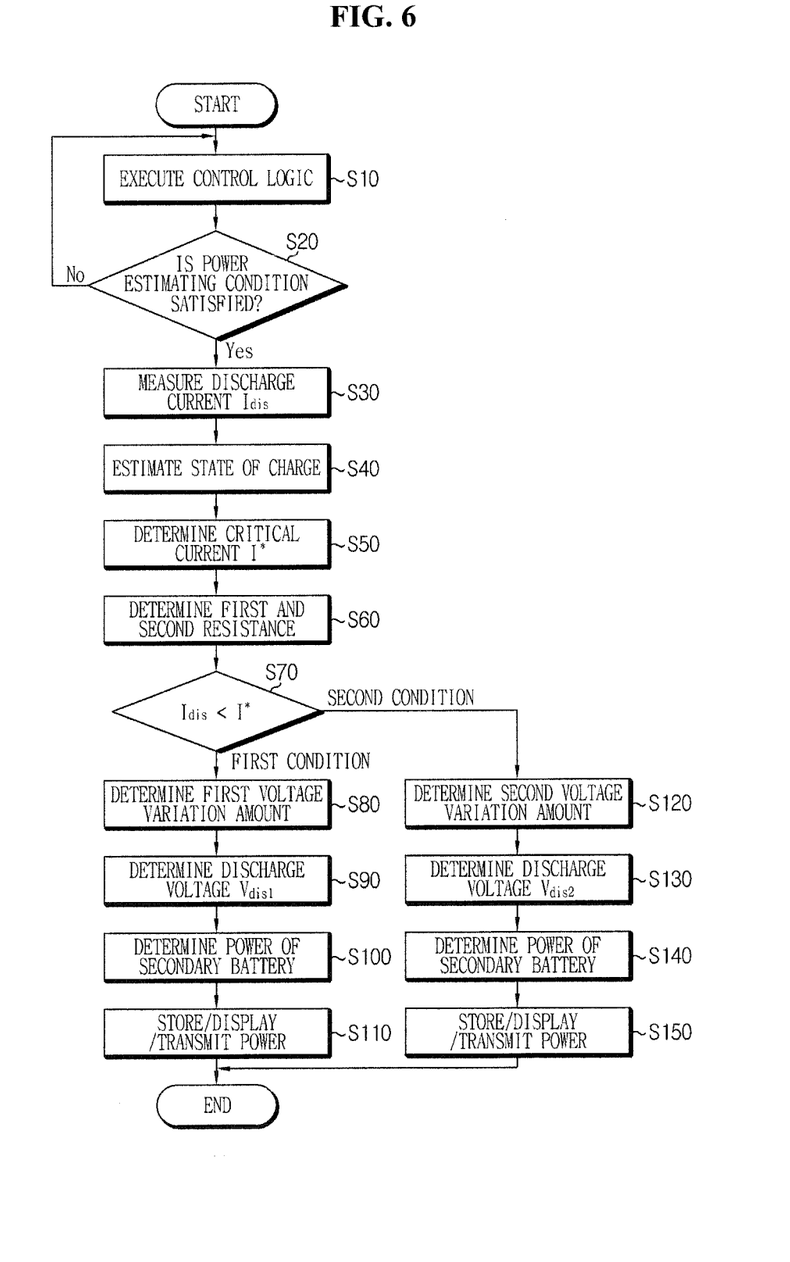
FIG. 6 is a flowchart illustrating a method for estimating the power of a secondary battery according to an exemplary example of the present disclosure.

FIG. 6 is a flowchart chronologically illustrating the method for estimating the power of a secondary battery according to an exemplary example of the present disclosure.

First, in S10, the control unit 120 reads control logic needed to estimate the power of the secondary battery from the storage unit 140 and executes the control logic.

Subsequently, in S20, the control unit 120 determines whether a condition for estimating the power is satisfied.

Here, the power estimating condition may be established when a power estimation request signal is received from an external device through the communication interface 150. To do so, the control unit 120 may monitor whether the power estimation request signal is received through the communication interface 150. Alternatively, the power estimating condition may be set to be established each time a predetermined time passes. To do so, the control unit 120 may count a time, and when the counted time reaches a preset reference time, decide that the power estimating condition is established.

In S20, when the power estimating condition is determined to be satisfied, the control unit 120 goes on to S30 in the process. On the contrary, in S20, when the power estimating condition is not determined to be satisfied, the control unit 120 holds the progress of the process.

In S30, the control unit 120 measures a discharge current ($I_{dis}$) of the secondary battery 130 by controlling the sensor 110. Subsequently, in S40, the control unit 120 estimates an SOC of the secondary battery 130. As an example, the SOC may be estimated by the Ampere counting method. However, the present disclosure is not limited thereto.

In S50, the control unit 120 determines a magnitude of a critical current (I*) corresponding to the estimated SOC. The magnitude of the critical current (I*) may be determined by referring to data predefined for each SOC and stored in the storage unit 140. Alternatively, the magnitude of the critical current (I*) may be determined in real time by Equation 1.

In S60, the control unit 120 determines a first resistance ($R_1$) and a second resistance ($R_2$) corresponding to the estimated SOC. The first resistance ($R_1$) and the second resistance ($R_2$) may be determined by referring to data predefined for each SOC and stored in the storage unit 140.

In S70, the control unit 120 compares the measured magnitude of the discharge current ($I_{dis}$) to the magnitude of the critical current (I*). If the measured magnitude of the discharge current ($I_{dis}$) is smaller than the magnitude of the critical current (I*), the control unit 120 determines that the first condition is satisfied and goes to S80 in the process. In contrast, if the measured magnitude of the discharge current ($I_{dis}$) is not smaller than the magnitude of the critical current (I*), the control unit 120 determines that the second condition is satisfied and goes to S120 in the process.

In S80 performed under the first condition, the control unit 120 calculates a first voltage variation amount ($\Delta V_{dis1}$) when the discharge current ($I_{dis}$) flows using a first resistance ($R_1$). Also, in S90, the control unit 120 determines a discharge voltage ($V_{dis1}$) using the first voltage variation amount ($\Delta V_{dis1}$). Preferably, the discharge voltage ($V_{dis1}$) may be determined by the above Equation 2, and the parameter V1 of Equation 2 may be determined by referring to open-circuit voltage data predefined for each SOC and stored in the storage unit 140. Also, in S100, the control unit 120 determines the power ($P_{dis1}$) of the secondary battery 130 from the determined discharge voltage ($V_{dis1}$) and the measured magnitude of the discharge current ($I_{dis}$). Also, in S110, the control unit 120 may store the determined power ($P_{dis1}$) in the storage unit 140, and/or display it as a graphical interface through the display unit 160, and/or transmit it to an external device through the communication interface 150.

In S120 performed when the second condition is satisfied, the control unit 120 calculates a second voltage variation amount ($\Delta V_{dis2}$) when the discharge current ($I_{dis}$) flows using a second resistance ($R_2$). Also, in S130, the control unit 120 determines a discharge voltage ($V_{dis2}$) using the second voltage variation amount ($\Delta V_{dis2}$). Preferably, the discharge voltage ($V_{dis2}$) may be determined by the above Equation 2, and the parameter $V_2$ of Equation 2 may be determined by referring to voltage data predefined for each SOC and stored in the storage unit 140. Also, in S140, the control unit 120 determines the power ($P_{dis2}$) of the secondary battery 130 from the determined discharge voltage ($V_{dis2}$) and the measured magnitude of the discharge current ($I_{dis}$). Also, in S150, the control unit 120 may store the determined power ($P_{dis2}$) in the storage unit 140, and/or display it as a graphical interface through the display unit 160, and/or transmit it to an external device through the communication interface 150.

In the present disclosure, at least one of various control logics and/or calculation logics of the control unit 120 may be selectively combined, and the combined control logics may be written in a computer-readable code and recorded in a computer-readable recording medium.

The recording medium is not limited to a specific type if it is accessible by a processor included in a computer. As an example, the recording medium includes at least one selected from the group consisting of ROM, RAM, a register, a compact disc read-only memory (CD-ROM), a magnetic tape, a hard disc, a floppy disc, and an optical data recording device.

Also, the computer-readable code may be modulated to a carrier signal and included in a communication carrier at a particular point in time, and may be distributed over network-coupled computer systems so that the computer-readable code is stored and executed in a distributed fashion. Also, functional programs, codes, and code segments for implementing the combined control logics may be easily inferred by programmers in the technical field to which the present disclosure belongs.

In the present disclosure, there is no special limitation on materials that may be used as the first cathode material and the second cathode material if they are materials having different operating voltage ranges.

According to one aspect, the first cathode material may be an alkali metal compound represented by a general chemical formula $A[A_xM_y]O_{2+z}$ (A includes at least one of Li, Na, and K; M includes at least one element selected from Ni, Co, Mn, Ca, Mg, Al, Ti, Si, Fe, Mo, V, Zr, Zn, Cu, Al, Mo, Sc, Zr, Ru, and Cr; x≥0, 1≤x+y≤2, −0.1≤z≤2; x, y, z, and a stoichiometric coefficient of an element included in M is selected such that the compound maintains electrical neutrality), or an alkali metal compound, as disclosed in U.S. Pat. No. 6,677,082 and U.S. Pat. No. 6,680,143, $xLiM^1O_2-(1-x)Li_2M^2O_3$ ($M^1$ includes at least one element having an average oxidation state equal to 3; $M^2$ includes at least one element having an average oxidation state equal to 4; 0≤x≤1).

According to another aspect, the second cathode material may be lithium metal phosphate represented by a general chemical formula $Li_aM^1{}_xFe_{1-x}M^2{}_yP_{1-y}M^3{}_zO_{4-z}$ ($M^1$ includes at least one element selected from Ti, Si, Mn, Co, Fe, V, Cr, Mo, Ni, Nd, Mg, and Al; $M^2$ includes at least one element selected from Ti, Mn, Co, Fe, Cr, Mo, Ni, Nd, Al, Mg, As, Sb, Si, Ge, V, and S; $M^3$ includes at least one element selected from elements in a halogen family including F; 0<a≤2, 0≤x≤1, 0≤y≤1, 0≤z<1; a, x, y, z, and a stoichiometric coefficient of an element included in $M^1$, $M^2$, and $M^3$ is selected such that the compound maintains electrical neutrality) or $Li_3M_2(PO_4)_3$ [M includes at least one element selected from Ti, Si, Mn, Fe, Co, V, Cr, Mo, Ni, Mg, and Al].

According to still another aspect, the first cathode material may be $Li[Li_aNi_bCo_cMn_d]O_{2+z}$ [a≥0; a+b+c+d=1; at least one of b, c, and d is not zero; −0.1≤z≤2], and the second cathode material may be $LiFePO_4$, $LiMn_xFe_yPO_4$ (0<x+y≤1) or $Li_3Fe_2(PO_4)_3$.

According to yet another aspect, the first cathode material and/or the second cathode material may include a coating layer. The coating layer may include a carbon layer, or may include an oxide layer or a fluoride layer including at least one element selected from the group consisting of Ti, Mn, Co, Fe, Cr, Mo, Ni, Nd, Mg, Al, As, Sb, Si, Ge, V, and S.

In the present disclosure, types and a blend ratio of the first cathode material and the second cathode material is selected such that a convex pattern appears on a discharge resistance profile or at least one voltage plateau appears in a voltage profile, while considering the purpose of use and performance of a secondary battery intended to manufacture.

In one embodiment, in the case where a secondary battery with high discharge power is desired, $Li[Ni_{1/3}Mn_{1/3}Co_{1/3}]O_2$ and $LiFePO_4$ may be selected as the first cathode material and the second cathode material, respectively, and a blend ratio of the first cathode material and the second cathode material may be set to 5:5.

In another embodiment, in the case where a secondary battery with high-temperature stability is desired, $Li[Ni_{1/3}Mn_{1/3}Co_{1/3}]O_2$ and $LiFePO_4$ may be selected as the first cathode material and the second cathode material, respectively, and a blend ratio of the first cathode material and the second cathode material may be set to 2:8.

In still another embodiment, in the case where a low cost secondary battery is desired, $Li[Ni_{1/3}Mn_{1/3}Co_{1/3}]O_2$ and $LiFePO_4$ may be selected as the first cathode material and the second cathode material, respectively, and a blend ratio of the first cathode material and the second cathode material may be set to 1:9.

In yet another embodiment, in the case where a secondary battery with high discharge power and high-temperature stability is desired, $[Ni_{1/3}Mn_{1/3}Co_{1/3}]O_2$ and $LiFePO_4$ may be selected as the first cathode material and the second cathode material, respectively, and a blend ratio of the first cathode material and the second cathode material may be set to 4:6.

In further another embodiment, in the case where a secondary battery with high capacity per weight is desired, $Li[Ni_{0.5}Mn_{0.3}Co_{0.2}]O_2$ and $LiFePO_4$ may be selected as the first cathode material and the second cathode material, respectively, and a blend ratio of the first cathode material and the second cathode material may be set to 9:1.

Methods of selecting the first cathode material and second cathode material and adjusting the blend ratio are just one example. Accordingly, it is obvious to a person having ordinary skill in the art that the first cathode material and the second cathode material and the blend ratio thereof may be properly selected in consideration of a relative weight and balance of electrochemical properties with which the blended cathode material is characterized.

In the present disclosure, a number of cathode materials that may be included in the blended cathode material are not limited to two. As one embodiment, the blended cathode material may include three different cathode materials, for example, a blended cathode material including $LiMn_2O_4$, $Li[Li_aNi_xCo_yMn_z]O_2$ [$a≥0$; $x+y+z=1$; at least one of x, y, and z is not zero], and $LiFePO_4$. As another embodiment, the blended cathode material may include four different cathode materials, for example, a blended cathode material including $LiNiO_2$, $LiMn_2O_4$, $Li[Li_aNi_xCo_yMn_z]O_2$ [$a≥0$; $x+y+z=1$; at least one of x, y, and z is not zero], and $LiFePO_4$.

Also, to enhance the properties of the blended cathode material, other additives, for example, a conductive material, a binder, and the like, may be added to the blended cathode material, and there is no particular limitation thereto. Accordingly, any blended cathode material including at least two cathode materials may be construed as being included in the scope of the present disclosure regardless of a number of cathode materials and the presence of other additives.

Hereinabove, the present disclosure has been described in detail. However, it should be understood that the detailed description and specific examples, while indicating preferred embodiments of the disclosure, are given by way of illustration only, since various changes and modifications within the spirit and scope of the disclosure will become apparent to those skilled in the art from this detailed description.

What is claimed is:

1. An apparatus for estimating the power of a secondary battery, comprising:
   a sensor configured to measure a discharge current of a secondary battery comprising a cathode including a blended cathode material, an anode, and a separator, the blended cathode material including at least a first cathode material and a second cathode material, and an operating voltage range of the first cathode material being higher than an operating voltage range of the second cathode material; and
   a control unit configured to estimate a state of charge of the secondary battery, determine a discharge voltage of the secondary battery using a first resistance predefined corresponding to the state of charge under a first condition in which a magnitude of the discharge current is smaller than a magnitude of a critical current and a second resistance predefined corresponding to the state of charge under a second condition in which the magnitude of the discharge current is larger than the magnitude of the critical current, and determine the power of the secondary battery from the determined discharge voltage and the measured discharge current.

2. The apparatus for estimating the power of a secondary battery according to claim 1, wherein the control unit is configured to determine, under the first condition, the discharge voltage of the secondary battery using a first voltage variation amount calculated from the first resistance and the magnitude of the discharge current.

3. The apparatus for estimating the power of a secondary battery according to claim 2, wherein the control unit determines the discharge voltage of the secondary battery by reducing the first voltage variation amount from a first voltage of the secondary battery predefined corresponding to the estimated state of charge.

4. The apparatus for estimating the power of a secondary battery according to claim 3, wherein the first voltage is an open-circuit voltage before the start of discharge of the secondary battery.

5. The apparatus for estimating the power of a secondary battery according to claim 1, wherein the control unit is configured to determine, under the second condition, the discharge voltage of the secondary battery using a second voltage variation amount calculated from the second resistance and the magnitude of the discharge current.

6. The apparatus for estimating the power of a secondary battery according to claim 5, wherein the control unit determines the discharge voltage of the secondary battery by reducing the second voltage variation amount from a second voltage of the secondary battery predefined corresponding to the estimated state of charge.

7. The apparatus for estimating the power of a secondary battery according to claim 6, wherein the second voltage is a voltage at which the second cathode material starts to get involved in an electrochemical reaction when the secondary battery is discharged.

8. The apparatus for estimating the power of a secondary battery according to claim 1, wherein the magnitude of the critical current is a value predefined based on the state of charge of the secondary battery.

9. The apparatus for estimating the power of a secondary battery according to claim 1, wherein the magnitude of the critical current is determined from an I-V profile corresponding to the state of charge of the secondary battery.

10. The apparatus for estimating the power of a secondary battery according to claim 1, further comprising:
a storage unit connected with the control unit,
wherein the control unit is configured to store the determined power of the secondary battery in the storage unit.

11. The apparatus for estimating the power of a secondary battery according to claim 1, further comprising:
a communication interface connected with the control unit,
wherein the control unit is configured to output the determined power of the secondary battery to outside through the communication interface.

12. The apparatus for estimating the power of a secondary battery according to claim 1, further comprising:
a display unit connected with the control unit,
wherein the control unit is configured to display the determined power of the secondary battery as a graphical interface through the display unit.

13. The apparatus for estimating the power of a secondary battery according to claim 1, further comprising:
a storage unit configured to store the predefined value.

14. An electric drive device comprising the apparatus for estimating the power of a secondary battery according to claim 1.

15. A method for estimating the power of a secondary battery, comprising:
(a) measuring a discharge current of a secondary battery comprising a cathode including a blended cathode material, an anode, and a separator, the blended cathode material including at least a first cathode material and a second cathode material, and an operating voltage range of the first cathode material being higher than an operating voltage range of the second cathode material;
(b) estimating a state of charge of the secondary battery;
(c) determining a discharge voltage of the secondary battery using a first resistance predefined corresponding to the state of charge under a first condition in which a magnitude of the discharge current is smaller than a magnitude of a critical current and a second resistance predefined corresponding to the state of charge under a second condition in which the magnitude of the discharge current is larger than the magnitude of the critical current; and
(d) determining the power of the secondary battery from the determined discharge voltage and the measured discharge current.

16. The method for estimating the power of a secondary battery according to claim 15, wherein the step (c) comprises determining, under the first condition, the discharge voltage of the secondary battery using a first voltage variation amount calculated from the first resistance and the magnitude of the discharge current.

17. The method for estimating the power of a secondary battery according to claim 16, wherein the discharge voltage of the secondary battery is determined by reducing the first voltage variation amount from a first voltage of the secondary battery predefined corresponding to the estimated state of charge.

18. The method for estimating the power of a secondary battery according to claim 17, wherein the first voltage is an open-circuit voltage before the start of discharge of the secondary battery.

19. The method for estimating the power of a secondary battery according to claim 15, wherein the step (c) comprises determining, under the second condition, the discharge voltage of the secondary battery using a second voltage variation amount calculated from the second resistance and the magnitude of the discharge current.

20. The method for estimating the power of a secondary battery according to claim 19, wherein the discharge voltage of the secondary battery is determined by reducing the second voltage variation amount from a second voltage of the secondary battery predefined corresponding to the estimated state of charge.

21. The method for estimating the power of a secondary battery according to claim 20, wherein the second voltage is a voltage at which the second cathode material starts to get involved in an electrochemical reaction when the secondary battery is discharged.

22. The method for estimating the power of a secondary battery according to claim 15, wherein the magnitude of the critical current is a value predefined based on the state of charge of the secondary battery.

23. The method for estimating the power of a secondary battery according to claim 15, wherein the magnitude of the critical current is determined from an I-V profile predefined based on the state of charge of the secondary battery.

24. The method for estimating the power of a secondary battery according to claim 15, further comprising:
storing the determined power of the secondary battery;
outputting the determined power of the secondary battery to outside; or
displaying the determined power of the secondary battery as a graphical interface.

25. A non-transitory computer-readable recording medium having a computer program recorded thereon for performing the method for estimating the power of a secondary battery according to claim 15.

* * * * *